(12) United States Patent
Pickering

(10) Patent No.: US 6,466,098 B2
(45) Date of Patent: Oct. 15, 2002

(54) ANALOGUE-CONTROLLED PHASE INTERPOLATOR

(75) Inventor: Andrew Pickering, Rugby (GB)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 09/792,202

(22) Filed: Feb. 23, 2001

(65) Prior Publication Data

US 2002/0125960 A1 Sep. 12, 2002

(51) Int. Cl.$^7$ .............................. H03L 7/099; H03B 5/24
(52) U.S. Cl. .............................. 331/25; 331/1 A; 331/8; 331/34; 331/45; 331/57; 331/177 R; 327/156; 327/159; 375/376
(58) Field of Search .............................. 331/1 A, 8, 25, 331/34, 45, 57, 177 R; 327/156–159; 360/51; 375/376; 455/260

(56) References Cited

U.S. PATENT DOCUMENTS 6,005,448 A * 12/1999 Pickering et al. .............. 331/57
6,107,848 A * 8/2000 Pickering et al. ........... 327/146

* cited by examiner

*Primary Examiner*—David Mis
(74) *Attorney, Agent, or Firm*—William B. Kempler; W. James Brady; Frederick J. Telecky, Jr.

(57) ABSTRACT

Apparatus for generating an oscillating signal in a desired phase relationship with an input signal, including a mixer arranged to receive a pair of reference signals oscillating at a common frequency and having a phase offset between them, and to mix the reference signals in variable proportions according to the value of input weighting signals to generate an output signal. A comparator is to compare the phase of the output signal with that of the input signal to determine whether the signals are in the desired phase relationship and, if not, to output one or more control signals indicative of the required adjustment in the phase of the output signal to achieve the desired phase relationship. An adjustable ring oscillator including a plurality of stages is connected in a ring and arranged to propagate oscillations around the ring. The ring oscillator is responsive to one or more control signals to propagate the oscillations in first and second directions around the ring and is arranged to provide the weighting signals to the mixer from outputs of ones of its stages.

21 Claims, 5 Drawing Sheets

ANALOGUE-CONTROLLED PHASE INTERPOLATOR

BACKGROUND OF THE INVENTION

1. Field of the Invention

The present invention relates to the control of a phase interpolator circuit such as may be used to generate a data recovery clock signal from a pair of reference clocks.

2. Description of Related Art

In the general field of data transmission it is well known to need to generate, at a receiver, a clock signal in a well established phase relationship with the received data signal. This is used in the sampling or other processing of the received signal to recover the transmitted data. As transmission data rates increase it is ever more important to generate the data recovery clock signal with accuracy, and to have close control over its adjustment.

Our earlier application EP-A-0909035, which corresponds to U.S. Pat. No. 6,107,848 issued Aug. 22, 2000 and which is incorporated herein by reference, describes a phase synchronising arrangement, one possible use of which is the generation of a data recovery clock signal from a pair of quadrature related reference clock signals. Reference may be made to that application for a detailed discussion of the principles involved but an outline description is given in the following.

FIG. 1 is a phasor diagram illustrating the generation of a data recovery clock signal in a desired phase relationship to a pair of quadrature related reference clock signals CLK1, CLK2. If it is assumed that the desired clock signal should have a phase displacement of θ from CLK1, then the desired signal can be expressed as cos θ.CLK1+sin θ.CLK2. In the particular example shown, θ=150□ and so the desired signal is −0.87 CLK1+0.50 CLK2. It will be appreciated that any desired phase relationship can be generated by selection of suitable cos/sin pairs as the coefficients or weighting values for CLK1 and CLK2. This is illustrated in FIG. 2 where the weighting value for CLK1 is designated W1 and that for CLK2 is W2, and pairs of W1, W2 can be selected for desired values of the phase shift.

A schematic illustration of an implementation of a phase mixer to perform the above mixing is shown in FIG. 3. In this diagram each signal is represented by a pair of signal lines. The phase mixer comprises four differential amplifiers 31a, 31b, 32a, 32b each of which includes two transistors as illustrated in a conventional fashion.

Reference clock CLK1 is applied to amplifiers 31a, 31b with opposite polarities, such that one amplifier acts to add the reference clock to the sum signal, while the other subtracts it. The current sources I1p I1n control the extents to which the amplifiers add and subtract the reference signal. The current pair I1p I1n thus are equivalent to the differential circuit weighting W1 enabling W1 to be adjusted from +1 to −1. Correspondingly, CLK2 is applied to amplifiers 32a, 32b and I2p, I2n are equivalent to W2.

EP-A-0909035 describes in detail how suitable values of I1p I1n, I2p, I2n may be generated from a selection of switched current sources of various values. That switching arrangement, and others, however can only provide a certain number of W1, W2 pairs and hence the number of available phase shifts which can be selected is limited. This is illustrated in FIG. 4 which corresponds to the arrangement described in EP-A-0909035 and shows a situation where 12 evenly spaced phase shifts are available.

Such systems, which use a digital control to switch a set of current sources to set the weighting values and hence the phase shift have some drawbacks however. Principally, in the context of increasing data rates as mentioned above, problems arise because the resolution of the recovery clock phase adjustment is limited by the control logic. Also, non-ideal behaviour of the phase interpolator itself means it is increasingly difficult to maintain phase step size linearity for fine degrees of timing.

SUMMARY OF THE INVENTION

The present invention provides an arrangement for the generation of the control signals for a phase interpolator, designated I1p I1n, I2p, I2n in the above, such that the control signals may be adjusted more finely. More particularly the invention provides signals which represent a cos/sin pair, the phase of which can be adjusted continuously, or in sufficiently small steps, such that, when input as the control signals to a phase interpolator, fine phase control of the output of the interpolator can be achieved.

The preferred circuit used to implement the invention is a variation of a ring oscillator circuit, configured such that it provides a pair of signals which correspond to a cos/sin pair, the phase of which can be adjusted to adjust the phase of the interpolator output.

BRIEF DESCRIPTION OF THE DRAWINGS

The invention will be better understood from the following description of a preferred embodiment given by way of example with reference to the accompanying drawings, in which.

DETAILED DESCRIPTION

In summary, in the embodiment described in the following, a phase interpolator is arranged to generate a data recovery clock signal from a pair of quadrature related reference clocks by mixing the reference clocks according to weighting values. The frequency of the reference clocks should be close to or the same as the required frequency of the data recovery clock. The weighting values are generated by a reversible ring oscillator circuit which outputs a cos/sin pair the phase of which is adjusted by advancing or reversing the ring oscillation according to a phase comparison of the generated data recovery clock and received data.

Our earlier application EP-A-0828348, which corresponds to U.S. Pat. No. 6,005,448 issued Dec. 21, 1999 and which is incorporated herein by reference, describes a phase-tuned ring oscillator in which the frequency of oscillation of the ring can be adjusted. In particular the output of each stage in an N stage ring is fed forward M stages as a secondary input to the resulting stage as well as being input as the primary input to the immediately succeeding stage. The oscillation frequency can be adjusted by mixing in each stage the primary and secondary inputs in variable proportion.

The present embodiment is a particular form of that arrangement to generate the weighting values for the phase interpolator. In particular the number of stages N is even and the secondary feedforward, M=N−2. N being even means that signals in the required cos/sin relationship are available at opposite points in the ring. M being N−2 means that the output of each stage is input to the next stage as the primary input and to the immediately preceding stage as the secondary input.

Figure 5:
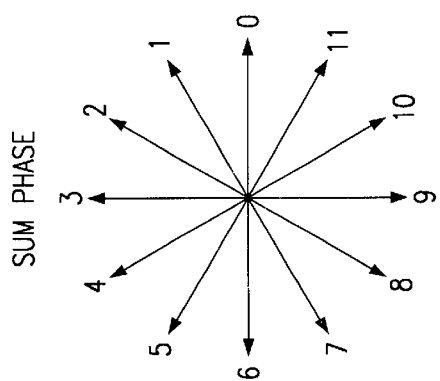
FIG. 5 illustrates the structure of one preferred form of control circuit according to the invention.
Figure 5:
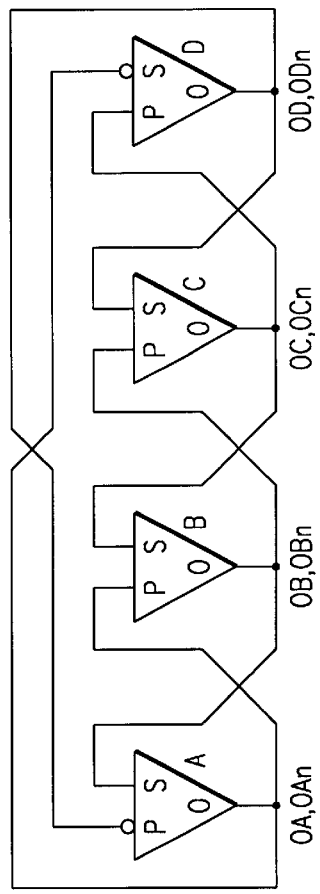

FIG. 5 illustrates this in the context of a four stage ring oscillator. In this diagram, the signals are shown as single lines, but in the preferred implementation each single line represents a differential pair. As can be seen in FIG. 5 the arrangement is symmetrical with regard to the primary (P) inputs and secondary (S) inputs to the stages. In the actual implementation there are also tuning inputs applied to each stage as described in detail in EP-A-0828348.

If the situation is considered where only one or other of the primary inputs or the secondary inputs is enabled at any one time it will be seen that FIG. 5 shows a reversible ring oscillator. In particular, if the P inputs are enabled the oscillation proceeds around the ring in the order A→B→C→D, while if the S inputs are enabled the oscillation proceeds in the reverse order A→D→C→B. Within this invention it would be possible to use continuous tuning between these conditions to achieve the desired result, effective performance is achieved by using a digital select to enable either the primary inputs or the secondary.

Figure 6:
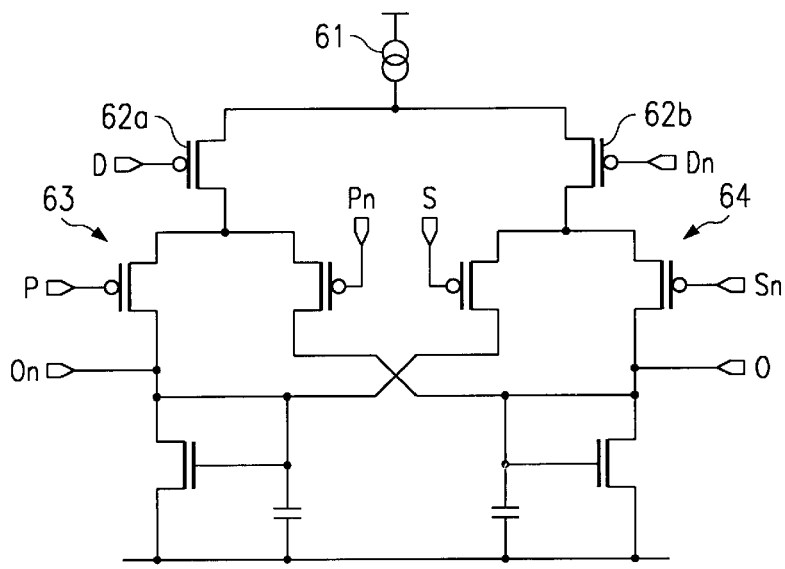
FIG. 6 illustrates the design of each stage in FIG. 5.

In this context a suitable form of stage design is shown in FIG. 6, This comprises a current source 61 connected to a pair of PMOS transistors 62a, 62b to which are applied signals D, Dn being a differential pair representing the digital control for the stage. The primary input P, Pn is applied to transistor pair 63 controlled by transistor 62a while the secondary input S, Sn is applied to transistor pair 64 controlled by transistor 62b. The state of control signal D, Dn will control whether the primary input P, Pn or the secondary input S, Sn is propagated as the output signal O, On, and hence whether the ring oscillates forwards or in reverse as mentioned above.

In a practical arrangement, the rate at which the phase interpolator is adjusted should be significantly lower than the frequency of the reference clocks. Thus the oscillation frequency of the ring oscillator is set lower than the reference clocks and it is designated a Low Frequency Reversible Oscillator (LFRO). Control of the phase interpolator is implemented by using outputs from the LFRO as the current weighting values. As mentioned above, the signals are taken from opposite points in the ring, eg. signals OA, OAn and OC, OCn.

Figure 1:
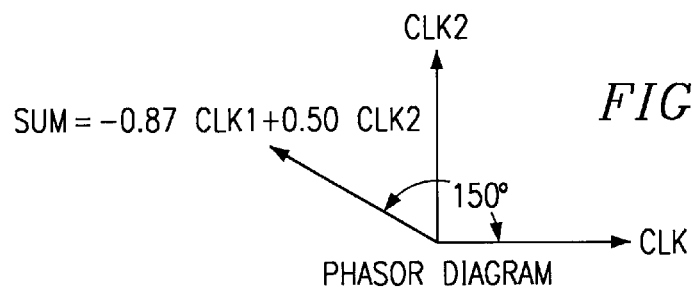
FIG. 1 is a phasor diagram illustrating the operation of a phase interpolator.
Figure 2:
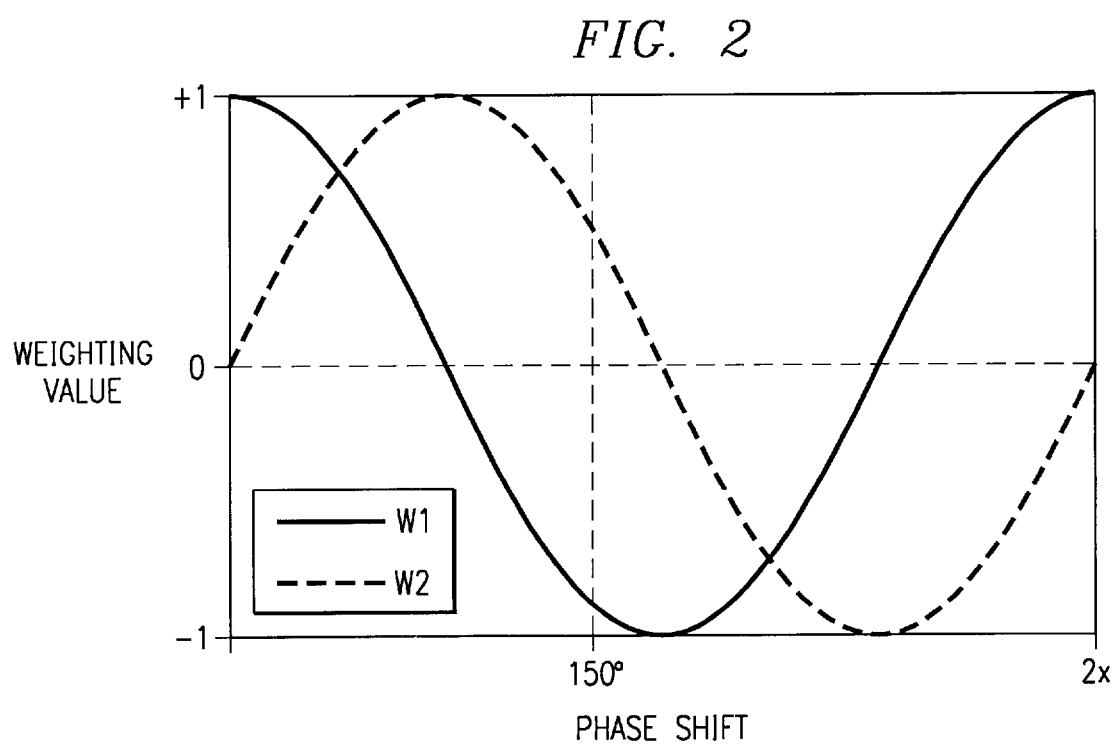
FIG. 2 illustrates the weighting values required in mixing as shown in FIG. 1.
Figure 3:
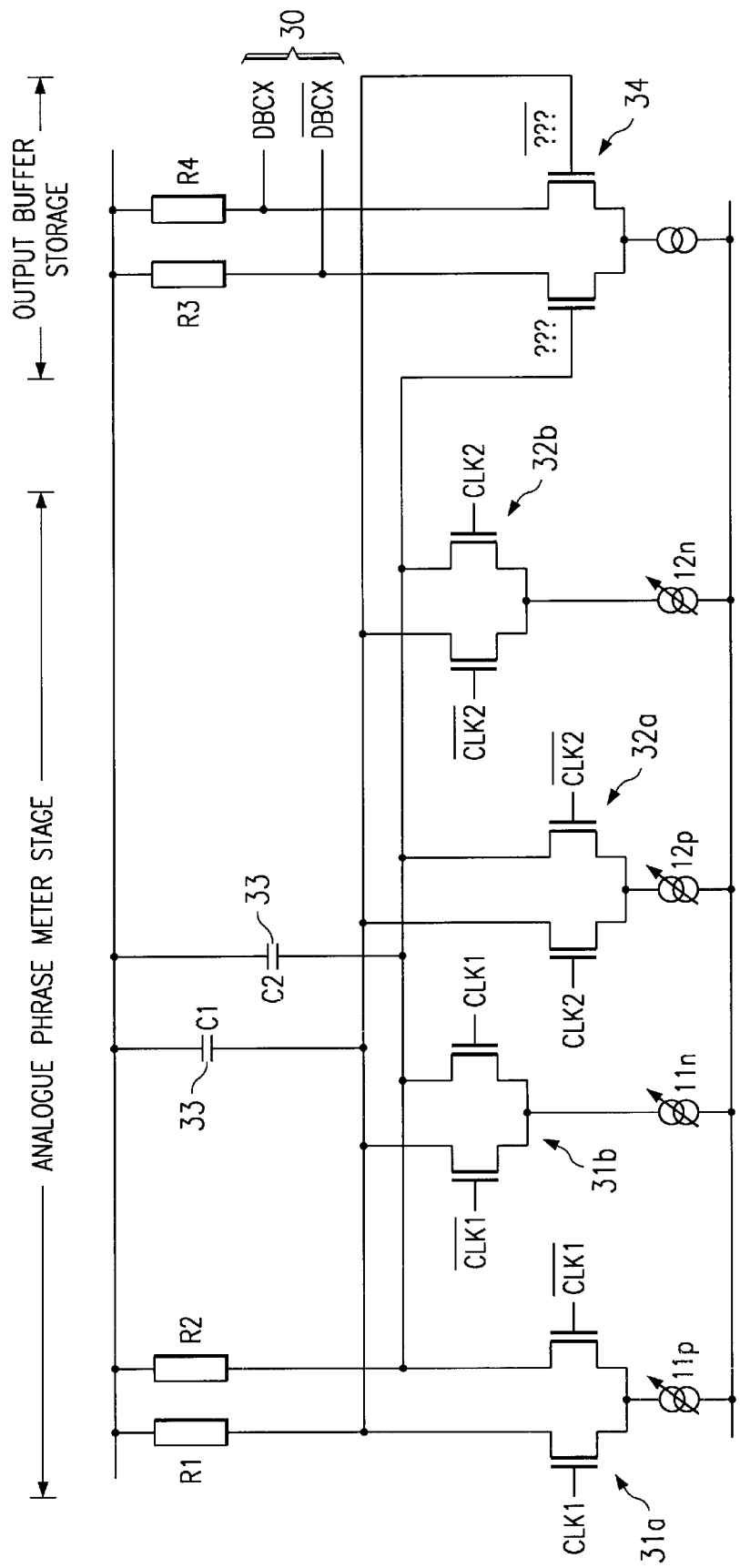
FIG. 3 illustrates the structure of one type of phase interpolator.
Figure 4:
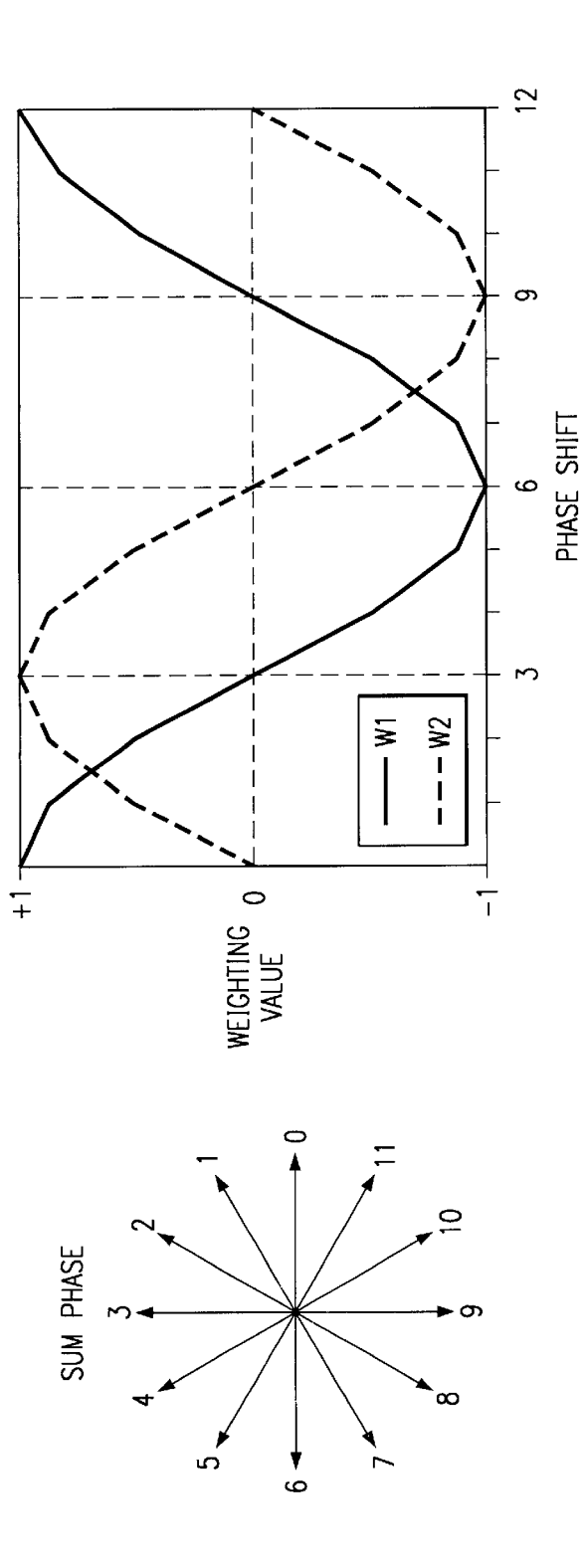
FIG. 4 illustrates the step-wise control of a phase interpolator according to the prior art.
Figure 7:
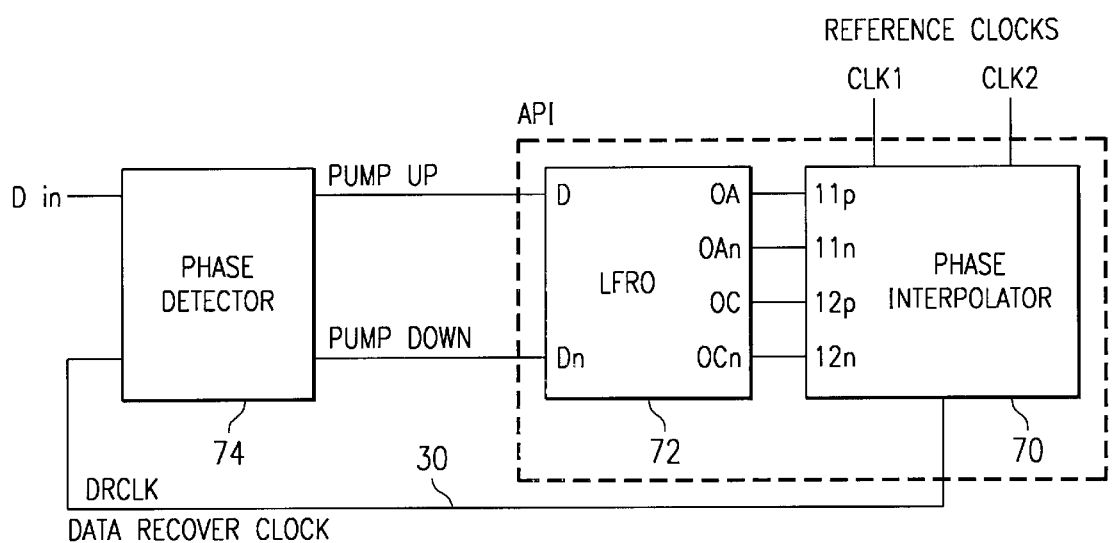
FIG. 7 illustrates the operation of the preferred embodiment in establishing a data recovery clock signal.

This is illustrated in FIG. 7. Phase interpolator 70, of the type shown in detail in FIG. 3, generates data recovery clock 30 from reference clocks CLK1, CLK2. The control inputs I1p I1n, I2p, I2n are taken as shown from LFRO 72 which is as shown in FIG. 5. As mentioned above control of the phase interpolator is effected by the LFRO setting the current weightings. When the LFRO ring is running forward the phase of the interpolator output will advance with respect to the reference clocks, producing an output with frequency $f_{ref}+f_{lfro}$, where $f_{ef}$ is the frequency of the reference clocks and $f_{lfro}$ is the frequency of the reference oscillator output. When the ring is reversed the output of the phase interpolator is gradually retarded with reference to the reference clocks, producing an output with frequency $f_{ref}-f_{lfro}$.

Finally then dynamic control of the direction of the ring oscillation adjusts the phase of the weighting values to obtain the required clock phase at the interpolator output. In the clock data recovery system of FIG. 7 this is achieved by the Phase Detector 74, an example configuration of which is shown in more detail in FIG. 8.

Figure 8:
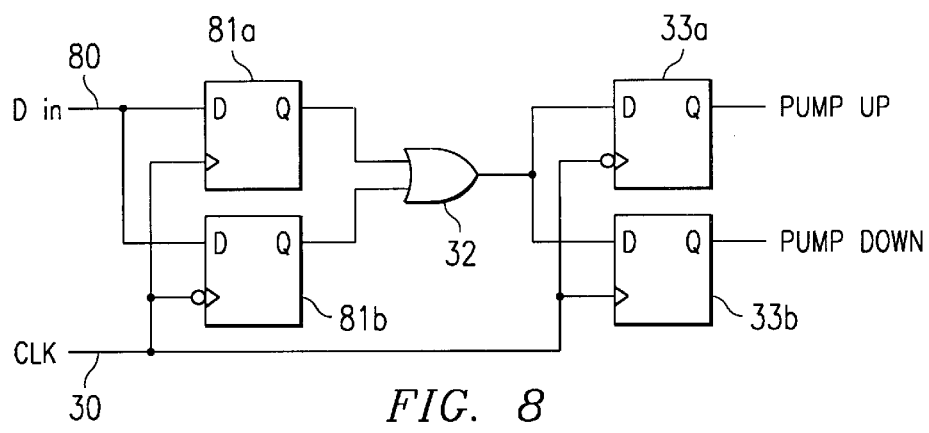
FIG. 8 illustrates an example phase detector suitable for use in FIG. 7.

In FIG. 8, the generated clock 30 is compared with the received data signal 80. Both signals are applied as shown to a pair of flip-flops 81a, 81b with each data transition being clocked through flip-flop 81a on a rising edge of CLK30 and through flip-flop 81b on a falling edge. Each data transition thus generates a pulse in the output of exclusive-OR gate 32 applied to D inputs of flip-flops 33a, 33b. If a rising edge in received data 80 precedes a rising edge in CLK30, the pulse in the output of gate 32 will begin the rising edge of CLK30 and will accordingly be clocked through flip-flop 33b by the same rising edge as a "pump down" signal. This is applied to Dn in the LFRO to retard the phase of the phase oscillator.

Figure 9:
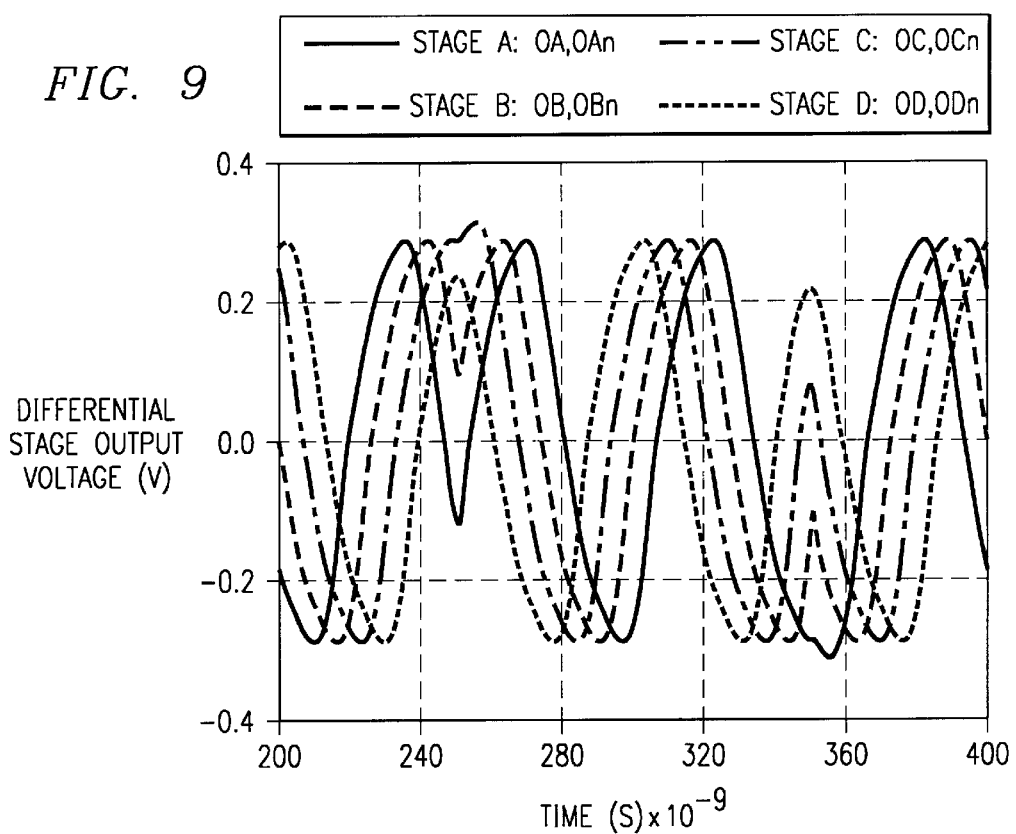
FIGS. 9 and 10 are diagrams showing oscillation signals of the circuit of FIG. 5.

The operation of a 4-stage LFRO is shown in FIG. 9. These plots show the differential voltage waveforms output from each of the stages in the ring. In this simulation the direction of oscillation was reversed at a time of 250 ns, and again at 350 ns under the control of an external input signal (not shown).

Figure 10:
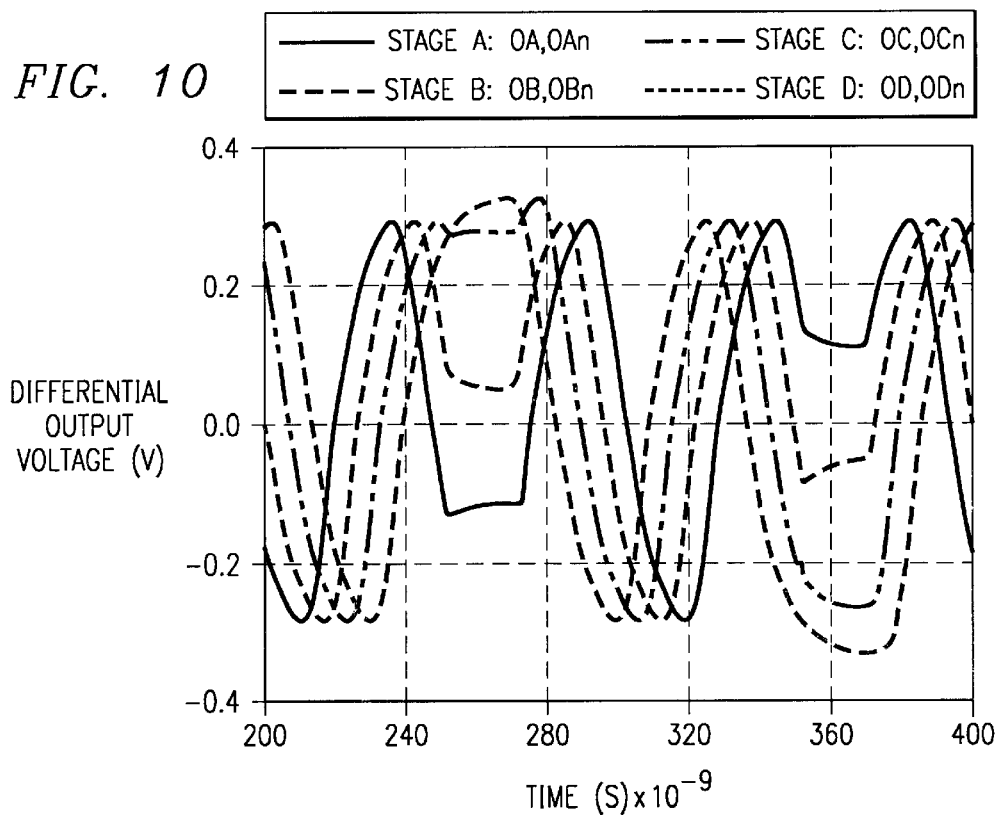

As described above, the normal manner of operation for the LFRO is simply to control the direction of oscillation using a differential logic signal. However, a further feature of the LFRO is the ability to freeze its operation by giving the primary and secondary stages in the ring equal weighting (ie. by setting the oscillation direction control input, D, to zero differential). In reality, this is not a perfect process, and the ring tends to carry on drifting slowly after it has been frozen. However, in practice this is unlikely to be a significant problem in a closed loop clock/data recovery system when the LFRO will be undergoing continual adjustments: the crucial point is that during this mode of operation, the oscillation signals in the ring do not collapse to zero since this would cause the phase interpolator output amplitude to die. This operation of the 4-stage LFRO is shown in FIG. 10: this is similar to FIG. 9 except that the LFRO is held static for a period of 20 ns when each change of oscillation direction occurs.

It will therefore be seen that this arrangement provides a simple configuration enabling close control of the phase of a phase interpolator without the need to provide a large number of different value current sources.

While the invention has been particularly shown and described with reference to preferred embodiments thereof, it is well understood by those skilled in the art that various changes and modifications can be made in the invention without departing from the spirit and the scope of the invention as defined by the appended claims.

What is claimed is:

1. Apparatus for generating an oscillating signal in a desired phase relationship with an input signal, comprising:
   mixing means arranged to receive a pair of reference signals oscillating at a common frequency and having a phase offset between them, and to mix said reference signals in variable proportions according to the value of input weighting signals to generate an output signal;
   comparing means arranged to compare the phase of said output signal with that of said input signal to determine whether said signals are in said desired phase relationship and, if not, to output one or more control signals indicative of the required adjustment in the phase of said output signal to achieve said desired phase relationship; and an adjustable ring oscillator comprising a plurality of stages connected in a ring and arranged to propagate oscillations around said ring, said ring oscillator being responsive to said one or more control signals to propagate said oscillations in first and second directions around said ring and being arranged to provide said weighting signals to said mixing means from outputs of ones of its stages.

2. Apparatus according to claim 1 wherein said reference signals are in quadrature relationship with each other and said ring oscillator has an even number of stages, whereby weighting signals having a mutual sine/cosine relationship are provided at opposite points in said ring.

3. Apparatus according to claim 1 wherein said ring oscillator, the output from each stage is input as a primary input to the next stage in the ring and as a secondary input to the immediately previous stage in the ring.

4. Apparatus according to claim 3 wherein said ring oscillator is responsive to said one or more control signals to propagate said oscillations around said ring in said first direction by enabling said primary inputs and disabling said secondary inputs and in said second direction by disabling said primary inputs and enabling said secondary inputs.

5. Apparatus according to claim 1 wherein the frequency of oscillation of said reference signals in the same as or similar to an expected frequency of oscillation of said input signal.

6. Apparatus according to claim 1 wherein the frequency of oscillation propagated around said ring oscillator is substantially lower than the frequency of said reference signals.

7. Apparatus according to claim 1 wherein said ring oscillator provides said weighting signals in the form of differential signal pairs.

8. Apparatus according to claim 7 wherein said mixing means comprising a plurality of differential amplifiers with each reference signal being applied to two of said differential amplifiers with opposite polarity and current in said two differential amplifiers being controlled respectively by the differential pair of one or said weighting signals, the sum of the outputs of said differential amplifiers being used to provide said output signal.

9. Apparatus according to claim 2, wherein, in said ring oscillator, the output from each stage is input as a primary input to the next stage in the ring and as a secondary input to the immediately previous stage in the ring.

10. Apparatus according to claim 2 wherein the frequency of oscillation of said reference signals in the same as or similar to an expected frequency of oscillation of said input signal.

11. Apparatus according to claim 3 wherein the frequency of oscillation of said reference signals in the same as or similar to an expected frequency of oscillation of said input signal.

12. Apparatus according to claim 4 wherein the frequency of oscillation of said reference signals in the same as or similar to an expected frequency of oscillation of said input signal.

13. Apparatus according to claim 2 wherein the frequency of oscillation propagated around said ring oscillator is substantially lower than the frequency of said reference signals.

14. Apparatus according to claim 3 wherein the frequency of oscillation propagated around said ring oscillator is substantially lower than the frequency of said reference signals.

15. Apparatus according to claim 4 wherein the frequency of oscillation propagated around said ring oscillator is substantially lower than the frequency of said reference signals.

16. Apparatus according to claim 5 wherein the frequency of oscillation propagated around said ring oscillator is substantially lower than the frequency of said reference signals.

17. Apparatus according to claim 2 wherein said ring oscillator provides said weighting signals in the form of differential signal pairs.

18. Apparatus according to claim 3 wherein said ring oscillator provides said weighting signals in the form of differential signal pairs.

19. Apparatus according to claim 4 wherein said ring oscillator provides said weighting signals in the form of differential signal pairs.

20. Apparatus according to claim 5 wherein said ring oscillator provides said weighting signals in the form of differential signal pairs.

21. Apparatus for generating an oscillating signal in a desired phase relationship with an input signal, comprising:

a mixer arranged to receive a pair of reference signals oscillating at a common frequency and having a phase offset between them, and to mix said reference signals in variable proportions according to the value of input weighting signals to generate an output signal;

a comparator arranged to compare the phase of said output signal with that of said input signal to determine whether said signals are in said desired phase relationship and, if not, to output one or more control signals indicative of the required adjustment in the phase of said output signal to achieve said desired phase relationship; and an adjustable ring oscillator comprising a plurality of stages connected in a ring and arranged to propagate oscillations around said ring, said ring oscillator being responsive to said one or more control signals to propagate said oscillations in first and second directions around said ring and being arranged to provide said weighting signals to said a mixer from outputs of ones of its stages.

* * * * *

UNITED STATES PATENT AND TRADEMARK OFFICE
CERTIFICATE OF CORRECTION

PATENT NO. : 6,466,098 B2
DATED : October 15, 2002
INVENTOR(S) : Andrew Pickering It is certified that error appears in the above-identified patent and that said Letters Patent is hereby corrected as shown below:

<u>Title page,</u>
Insert item :
-- (30) Foreign Application Priority Data

Feb. 23, 2000 [UK] United Kingdom ...............0004298.6 --

Signed and Sealed this

Ninth Day of September, 2003

JAMES E. ROGAN
*Director of the United States Patent and Trademark Office*